(12) United States Patent
Seita

(10) Patent No.: US 6,192,603 B1
(45) Date of Patent: Feb. 27, 2001

(54) VACUUM PROCESSING APPARATUS AND MAGNETIC SEAL ROTARY BEARING UNIT

(75) Inventor: Hisaharu Seita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/382,796

(22) Filed: Aug. 25, 1999

(30) Foreign Application Priority Data

Aug. 26, 1998 (JP) .................................................. 10-240785

(51) Int. Cl.[7] ...................................................... F26B 21/06
(52) U.S. Cl. ................................ 34/559; 34/92; 34/242; 310/90
(58) Field of Search .............................. 34/558, 559, 565, 34/92, 242; 310/90, 90.5

(56) References Cited

U.S. PATENT DOCUMENTS

| | | | |
|---|---|---|---|
| 4,902,531 | * 2/1990 | Nakayama et al. | 427/39 |
| 5,125,360 | * 6/1992 | Nakayama et al. | 118/730 |
| 5,686,941 | * 11/1997 | Kojima | 346/134 |
| 5,821,655 | * 10/1998 | Toksushima et al. | 310/90 |
| 5,975,536 | * 11/1999 | Helgeland | 277/410 |

FOREIGN PATENT DOCUMENTS

| | | |
|---|---|---|
| 7-169706 | 7/1995 | (JP) . |
| 9-131680 | 5/1997 | (JP) . |

* cited by examiner

Primary Examiner—Pamela Wilson
(74) Attorney, Agent, or Firm—Ronald P. Kananen; Rader, Fishman & Grauer

(57) ABSTRACT

A vacuum processing chamber preventing corrosion of a magnetic seal means and removing the heavy metals, organic matter, etc. produced by the corrosion, including a vacuum processing chamber, a rotated member (for example, a susceptor and a wafer holder), a rotary shaft penetrating one side of the vacuum chamber and rotating the rotated member, and a cavity being defined between an inner wall of the magnetic seal means and the rotary shaft, said magnetic seal means maintaining the air-tightness in the vacuum processing chamber by using a magnetic fluid in the cavity; a gas inlet introducing a barrier gas (for example, an inert gas like $N_2$, Ar, or He or an inert gas having a slight amount of $O_2$ added) to the cavity; and a gas outlet extracting a gas inside the cavity.

14 Claims, 9 Drawing Sheets

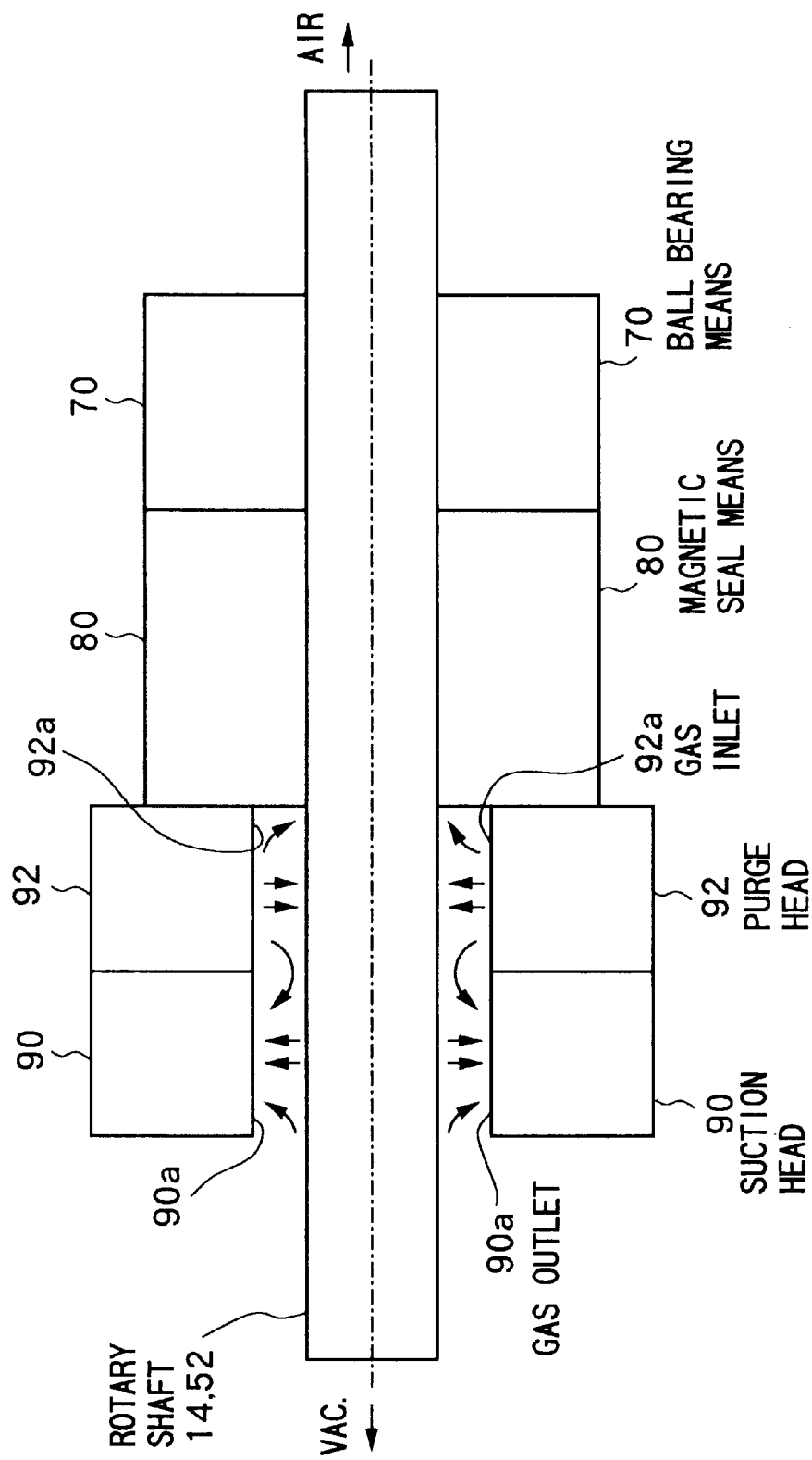
FIG.3 MAGNETIC SEAL ROTARY BEARING UNIT (ARRANGEMENT EXAMPLE 3)

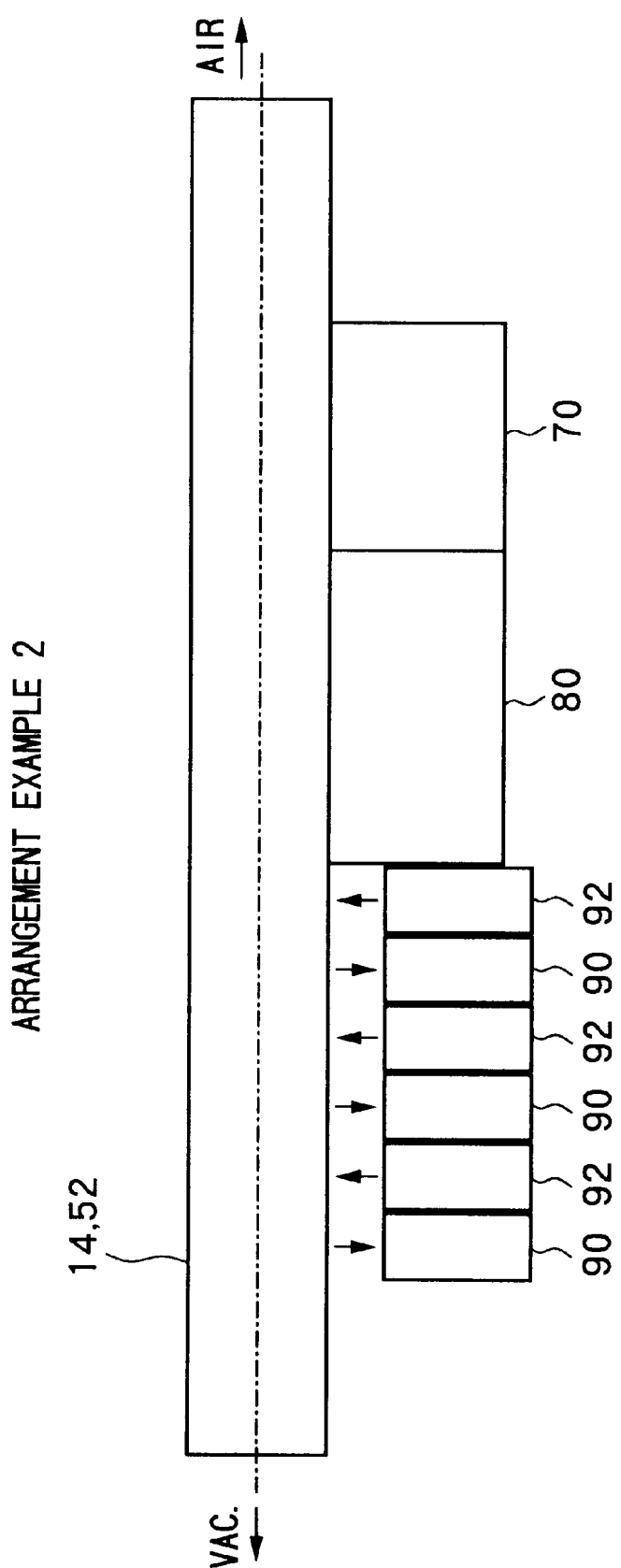

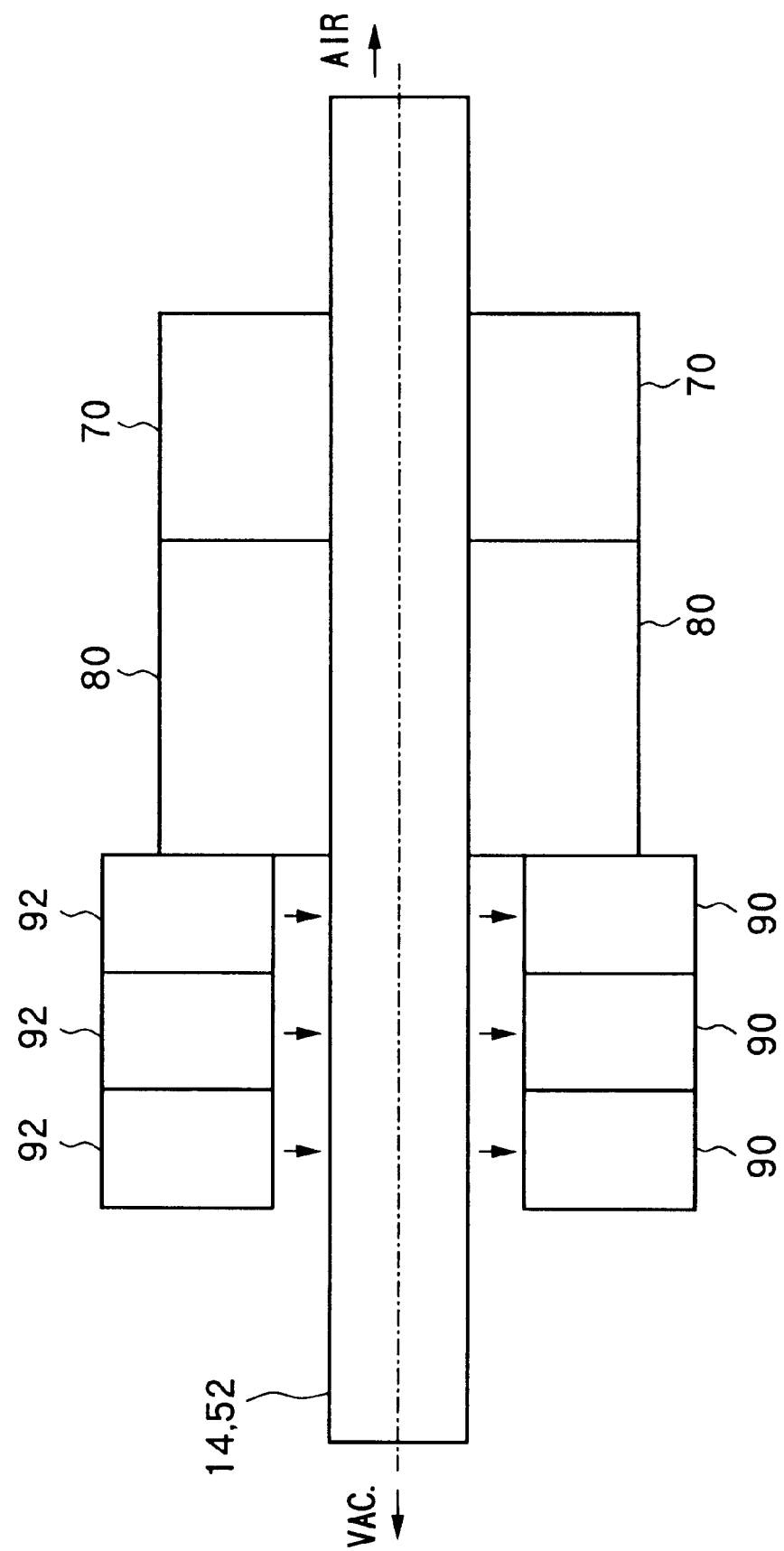
FIG.5 ARRANGEMENT EXAMPLE 3

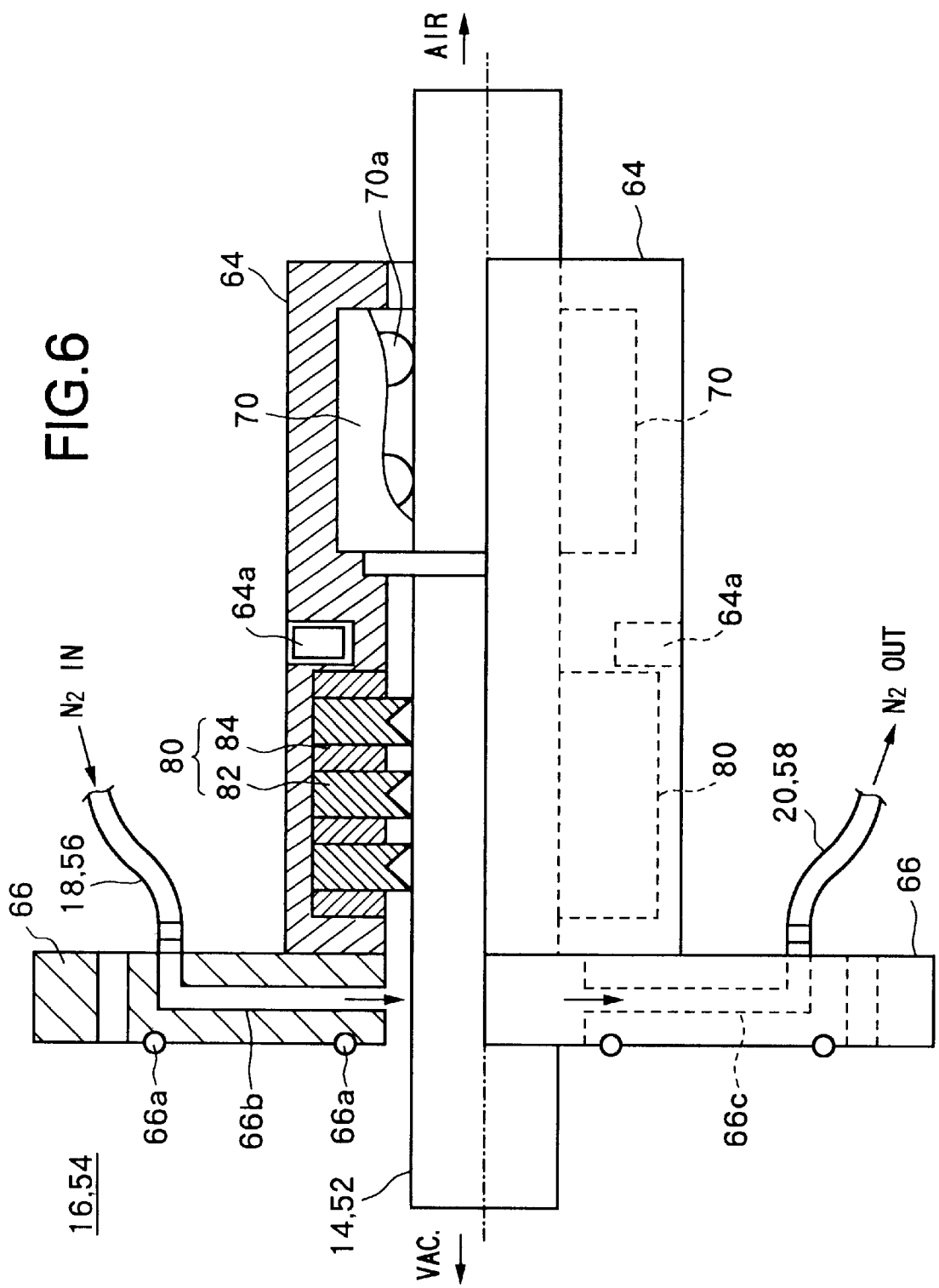

$G_1 \sim G_3$: MAGNETIC SEAL GAP

VACUUM PROCESSING APPARATUS AND MAGNETIC SEAL ROTARY BEARING UNIT

BACKGROUND OF THE INVENTION

1. Field of the Invention

The present invention relates to a magnetic seal bearing unit used for example for a wafer rotation mechanism, wafer transfer mechanism, etc. of an oxidation-diffusion furnace, chemical vapor deposition (CVD) apparatus, etc. for rotatably holding a rotary shaft while maintaining air-tightness of a vacuum processing chamber and to a vacuum processing apparatus.

2. Description of the Related Art

In the past, for example, an oxidation-diffusion furnace or CVD apparatus or other semiconductor processing apparatus has been improved in the uniformity of the processing by rotating the susceptor, wafer holder, etc. holding the wafer inside the vacuum processing chamber kept at a high vacuum.

Also, a system called "cluster tools" is used to successively perform different processing while holding a high vacuum and thereby improve the throughput. In this system, a plurality of processing chambers are provided around a common transfer chamber. After a processed wafer is taken out from a processing chamber by an arm of the wafer transfer mechanism provided in the transfer chamber, the wafer is transferred to another processing chamber.

A rotation mechanism for high vacuum required for these apparatuses is required to have a high air-tightness and not to produce any wafer contaminants.

For example, Japanese Unexamined Publication (Kokai) No. 7-169706 discloses an upright heat treatment apparatus having a rotation mechanism providing a drive side magnet at an outer casing secured to a pulley connected to a motor shaft by a belt and providing a driven side magnet at a rotary shaft and causing rotation of a wafer holder connected to the rotary shaft by the repulsion force of the two magnets along with the rotation of the pulley.

In this rotation mechanism, an inner casing secured to the bottom surface of the furnace is interposed between the outer casing and the rotary shaft at a predetermined distance from the two. Ceramic bearings having ceramic rollers are provided at a total of four locations above and below the two magnets between the inner casing and the outer casing and between the inner casing and the rotary shaft.

Accordingly, particles are generated from the ceramic bearings or due to damage of magnets made of brittle materials or corrosion due to gas from the furnace. There is therefore the problem that the wafer is contaminated by heavy metals and organic substances.

Accordingly, the upright heat treatment apparatus disclosed in this publication is designed with a feed pipe and an exhaust pipe for an inert gas provided between the furnace and the rotation mechanism and with the inert gas fed and discharged by a control unit for example for 10 seconds before evacuation in the furnace. At this time, in the rotation mechanism having the above structure, it is necessary to discharge the air around the magnets and around the ceramic bearings beneath them. A communicating pipe is formed in the rotary shaft to discharge the air inside the shaft space.

In this rotation mechanism, just the use of bearings using mutual contact of mechanical parts, such as ceramic bearings, becomes a cause for the generation of particles. Furthermore, it is necessary to provide a large number of ceramic bearings to obtain a high air-tightness. This makes it easier for particles to accumulate in the shaft space.

Also, since the communicating pipe for discharging the particles generated from the ceramic bearings and the above magnets to the outside is formed by working the rotary shaft, the mechanical strength of the rotary shaft is reduced.

Furthermore, looking at the control of the introduction of the inert gas, since the inert gas is fed and discharged only before evacuation in the furnace, contamination of the wafer due to the generation of particles during the following processing is unavoidable.

On the other hand, in place of such bearings using ceramic or other rollers, frequent use is now being made of magnetic seal bearings using magnetic fluid (magnetohydrodynamic) since the air-tightness is high and almost no particles are generated by contact of mechanical parts.

FIG. 8A shows the overall configuration of a magnetic seal bearing unit of the related art, and FIG. 8B shows the schematic structure of the magnetic seal portion.

The magnetic seal bearing unit 100 of the related art is, as shown in FIG. 8A, provided with a seal cap 102, a magnetic seal portion 104, and a ball bearing portion 106 inside its not illustrated unit housing from the vacuum processing chamber side. A rotary shaft 108 is provided penetrating through the center. One end of the vacuum processing chamber side of the rotary shaft 108 is provided with a susceptor or a wafer holder etc., while the other end is connected to a drive.

The magnetic seal 104 comprises, as shown in FIG. 8B, a member called a pole piece 110 and a permanent magnet 112. The pole piece 110 has a plurality of ridges 110a. A plurality of spaces called magnetic seal gaps G1 to G3 are formed therebetween.

The spaces between the ridges 110a of the pole piece and the rotary shaft 108 are filled with a magnetic fluid 114 made by mixing iron oxide-based fine particles in a solvent composed of vacuum oil. The magnetic fluid 114 has a high viscosity because of its being an oil base and accumulates at the tips of the ridges 110a so as to fill the spaces between the rotating rotary shaft 108 and the ridges 110a. Also, the magnetic fluid 114 is influenced by the magnetic field resulting from the permanent magnetic 112 due to the intermixture of the magnetic material. As a result, the magnetic fluid 114 is prevented from concentrating at the lower vacuum side due to the evacuation.

FIG. 9 shows the step-shaped changes of an inner pressure of the magnetic seal gap due to the evacuation. The abscissa of FIG. 9 indicates a distance x in the axial direction of the rotary shaft, and the ordinate indicates a pressure P.

As the evacuation proceeds, air bubbles start to move in the part of the magnetic fluid closest to the vacuum chamber due to the pressure difference between the two sides and an inner pressure P1 of the magnetic seal gap G1 gradually falls. When the inner pressure P1 of the magnetic seal gap G1 becomes lower to a certain degree, air bubbles start to move in the magnetic fluid of the part second closest to the vacuum processing chamber. In the same way, air bubbles start to move in the magnetic fluid of the part third closest in a chain reaction. As a result, a step shape difference is created in the inner pressures P1 to P3 of the magnetic seal gaps G1 to G3.

Finally, as shown in FIG. 9, the inner pressure P1 of the magnetic seal gap G1 closest to the vacuum processing chamber becomes the lowest, the inner pressure P3 of the magnetic seal gap G3 closest to the drive side becomes the closest value to the air pressure Pa, and the inner pressure P2 of the magnetic seal gap G2 becomes a value between the two.

In the magnetic seal portion 104, by providing a large number of contact points with the magnetic fluid 114, the pressure difference at the two sides of the parts of the magnetic fluid 114 becomes smaller and breakage of the seal is prevented. In other words, in order not to break the seal of the parts of the magnetic fluid even when evacuating quickly from the air pressure Pa, the volumes of the seal gaps G1 to G3 and the number of the contact points are determined in advance according to the maximum exhaust capability etc. of the usable vacuum pump.

A bearing using such a magnetic seal has a ball bearing portion 106 for a mechanical support. The air-tightness is maintained at a level higher than that of the magnetic seal portion 104. Also, the particles from the ball bearing portion 106 are blocked by the magnetic seal portion 104 and not introduced into the vacuum processing chamber, therefore there is the advantage that wafers are not contaminated by the particles generated from mechanical members contacting each other.

In a bearing using a magnetic seal of the related art, however, when using dichlorosilane ($SiH_2Cl_2$) or another gas which generates the corrosion product HCL such as in a CVD apparatus for forming a silicon nitride film, the material of the pole piece of the magnetic seal, that is, stainless steel, is corroded and sometimes ends up generating metal particles comprised of iron, chrome, nickel, etc.

Also, the vacuum oil serving as the solvent of the magnetic fluid deteriorates. When the temperature of the magnetic seal portion rises to tens of degrees to 150° C. due to, for example, the heating during the processing, the vacuum oil easily becomes volatile. Therefore, the vacuum oil itself and the decomposed matter and other organic substances fly about as well. At this time, the iron oxide, manganese oxide, etc. in the magnetic fluid are fly about together with the organic matter.

The degree of contamination of a wafer by such organic matter and metals is quite low comparing with that by particles generated from mechanical bearings. Furthermore, the contamination is, in many cases, limited to the case where the reaction gas is repeatedly used.

However, due to the recent miniaturization of semiconductor devices, it has been known that even a slight amount of contaminant from the magnetic seal portion can affect the device characteristics.

For example, when forming a silicon nitride film for prevent oxidization during LOCOS formation, even a slight amount of iron contamination ($1\times10^{13}$ atoms/$cm^3$) ruins the quality of the gate oxide film formed at the next step. As a result, the step stress time zero dielectric breakdown (TZDB) withstand voltage of a 9 nm gate oxide film sometimes declines.

Also, even slight contamination by organic matter and metals on the bear silicon region after removing the silicon nitride film leads to deterioration of the withstand voltage of the pn-junction.

As a result, it was learned that even chemical contamination of a level hardly considered a problem before could cause a drop in the yield of the devices.

On the other hand, there is an apparatus which is configured to continuously pass an inert gas to the vacuum reaction chamber (processing chamber) side of the magnetic seal. portion, however, not only is this not a fundamental solution to the wafer contamination, but also conversely spreads the contamination wider and can shorten the cycle of maintenance for cleaning and exchanging members inside the processing chamber due to the contamination spreading to the entire processing chamber.

The above disadvantages of corrosion due to a reactive gas are also seen in a wafer transfer arm operating a high vacuum. For example, Japanese Unexamined Patent Publication (Kokai) No. 9-131680 discloses the technique of protecting the mechanical portion of the wafer transfer arm used in a cluster tool etc. from the chemical atmosphere by covering the wafer transfer arm with a cover and by adjusting the pressure of the inert gas to be introduced inside the cover to, for example, higher than the surroundings to prevent entry of the reactive gas from the surroundings inside the cover.

In this publication, a magnetic seal is used as a specific example of a sealing means for increasing the air-tightness of the rotary shaft portion.

However, in the technique disclosed in this publication, the mechanism for adjusting the pressure after filling the inert gas in the cover in a wide range is complex.

Also, the higher the pressure inside the cover, the better the corrosion of the wafer transfer arm can be prevented, however, the amount of the inert gas becomes larger and the degree of vacuum of the surroundings ends up being lowered so a longer time ends up being taken for evacuation.

Furthermore, although a pressure difference is created between the inside and outside of the cover, if the set pressure inside the cover is kept down a little when it is not desired to reduce the degree of vacuum of the surroundings and lower the throughput, there is a possibility that the pressure inside the cover will become lower than the outside, for example, at the arm portion at the distal end from the inlet of the inert gas. In such a case, the magnet seal portion is exposed to the reactive gas since it is exposed to the surroundings, thus the magnetic seal portion is corroded or the vacuum oil is degraded, which results in the same disadvantage as explained above that wafer contamination spreads from the magnetic seal portion.

SUMMARY OF THE INVENTION

An object of the present invention is to provide a magnetic seal bearing unit which can prevent wafer contamination due to impurities generated from a magnetic seal portion effectively and by a simple configuration and a vacuum processing apparatus using the same.

According to a first aspect of the present invention, there is provided a vacuum processing apparatus comprising: a vacuum processing chamber; a rotated member rotated inside of the vacuum chamber;

a rotary shaft penetrating one side of the vacuum chamber and rotating the rotated member; a magnetic seal means provided at the outside of the vacuum processing chamber through which the rotary shaft is penetrated and around the rotary shaft of the outside of the vacuum processing chamber, a cavity being defined between an inner wall of the magnetic seal means and the rotary shaft, the magnetic seal means maintaining the air-tightness in the vacuum processing chamber by using a magnetic fluid in the cavity;

a gas inlet introducing a barrier gas to the cavity; and a gas outlet extracting a gas inside the cavity.

Preferably, the gas inlet and the gas outlet are arranged close to each other.

Alternatively, preferably, a plurality of the gas inlets and the gas outlets are provided and the gas inlets and gas outlets are arranged alternately.

Alternatively, preferably, the gas inlet and the gas outlet are arranged facing each other across the rotary shaft.

Preferably, further provision is made of at least one of a gas introduction pressure control means for controlling an introducing pressure of the barrier gas and a gas extraction pressure control means for controlling a extracting pressure of the gas outlet in a pipe communicating with the gas inlet or the gas outlet.

Preferably, the gas introduction pressure control means controls the flow rate of the barrier gas to 1 ml/min to 10 l/min.

Alternatively, preferably the gas introduction pressure control means and/or the extraction pressure control means controls the pressure in the cavity to 0.1 Pa to 100 Pa so as not to influence the vacuum processing.

Preferably, further provision is made of a housing secured air-tightly sealing the surroundings of a hole formed at one side of the vacuum processing chamber and a bearing means provided in the housing and rotatably supporting the rotary shaft passing through the hole and extending inside the vacuum processing chamber, the magnetic seal means being arranged between the hole and the bearing means.

Preferably, the gas inlet and the gas outlet are formed at the rotary shaft supporting housing.

Preferably, the barrier gas comprises an inert gas or an inert gas plus 100 ppm to 10% of oxygen.

According to a second aspect of the present invention, there is provided a magnetic seal rotary bearing unit comprising: a unit housing which flange portion is fixed on outside surrounding of a hole formed at one side of a vacuum processing chamber and penetrated by a rotary shaft of a vacuum processing apparatus; a bearing means provided at the inside of the unit housing for rotatably supporting the rotary shaft; a magnetic seal means provided at the inside of the unit housing and arranged between the bearing means and the flange portion, a cavity being defined between an inner wall of the magnetic seal means and rotary shaft, the magnetic seal means maintaining the air-tightness in the vacuum processing chamber by using a magnetic fluid in the cavity; a gas inlet introducing a barrier gas to the cavity; and a gas outlet extracting a gas inside the cavity.

Preferably, the gas inlet and the gas outlet are arranged close to each other.

Alternatively, preferably a plurality of the gas inlets and the gas outlets are provided and the gas inlets and gas outlets are arranged alternately.

Alternatively, preferably the gas inlet and the gas outlet are arranged facing each other across the rotary shaft.

In the vacuum processing apparatus and the magnetic seal bearing unit of the present invention configured as above, for example, while introducing the process gas to the vacuum processing chamber or during the processing, the gas inside the vacuum processing chamber (reactive gas etc.) is blocked by the barrier gas introduced from the gas inlet and does not reach the magnetic seal means. Therefore, the magnetic seal means is not corroded and no contaminants are generated from it either.

Also, even if contaminants are generated from the magnetic seal means, they are exhausted from a very close gas outlet to the outside.

Furthermore, by adjusting the introducing pressure of the barrier gas from the gas inlet and/or the extracting pressure of the gas outlet, almost all of the barrier gas can be exhausted to the outside while maintaining the effect of protection of the magnetic seal means by the barrier gas. As a result, the contaminants are no longer carried by the barrier gas to the inside of the vacuum processing chamber.

When there are several magnetic seal bearings, the introduction and exhaust of the barrier gas can be optimized in the individual magnetic seal bearings. Note that if a barrier gas comprised of an inert gas plus a slight amount of $O_2$ is used, it has a cleaning effect on the piping etc. so is further preferable.

BRIEF DESCRIPTION OF THE DRAWINGS

These and other objects and features of the present invention will become clearer from the following description of the preferred embodiments given with reference to the accompanying drawings, in which:

FIG. 3 is a schematic view of Arrangement Example 1 of the components in a magnetic seal rotary bearing unit according to an embodiment of the present invention;

FIG. 4 is a schematic view of Arrangement Example 2 of the components in a magnetic seal rotary bearing unit according to an embodiment of the present invention;

FIG. 5 is a schematic view of Arrangement Example 3 of the components in a magnetic seal rotary bearing unit according to an embodiment of the present invention;

FIG. 6 is a sectional view of an example of the structure of the magnetic seal rotary bearing unit of Arrangement Example 3;

DESCRIPTION OF THE PREFERRED EMBODIMENTS

Below, preferred embodiments of a vacuum processing apparatus and a magnetic seal rotary bearing unit according to the present invention will be described with reference to the accompanying drawings. Note that the present invention may be applied to, for example, a rotary bearing of a wafer transfer arm or other wafer transfer mechanism, but the case of application of the present invention to a wafer rotation mechanism will be explained here.

Figure 1:
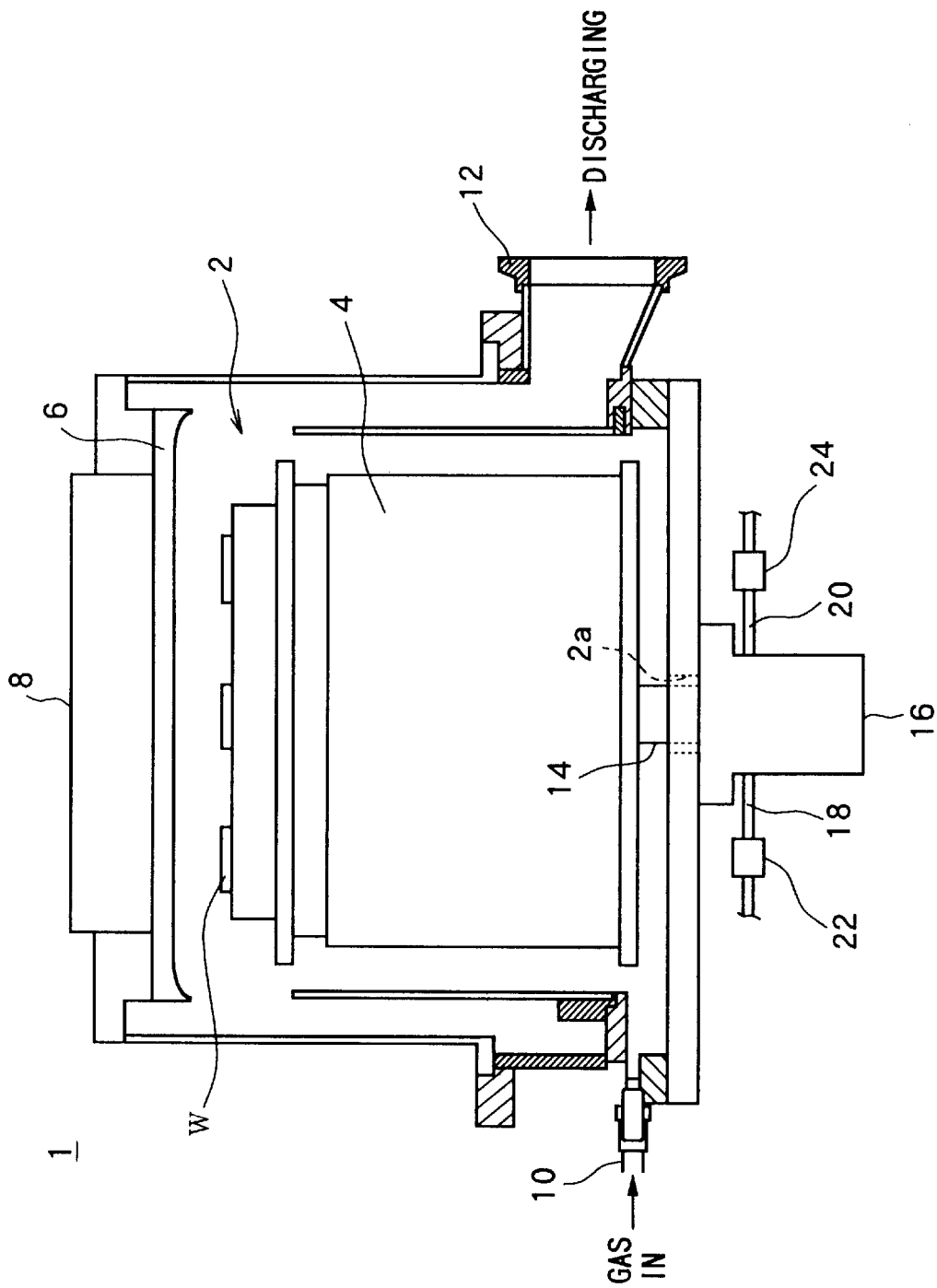
FIG. 1 is a view of the configuration of the core part of a CVD apparatus according to an embodiment of the present invention.
Figure 2:
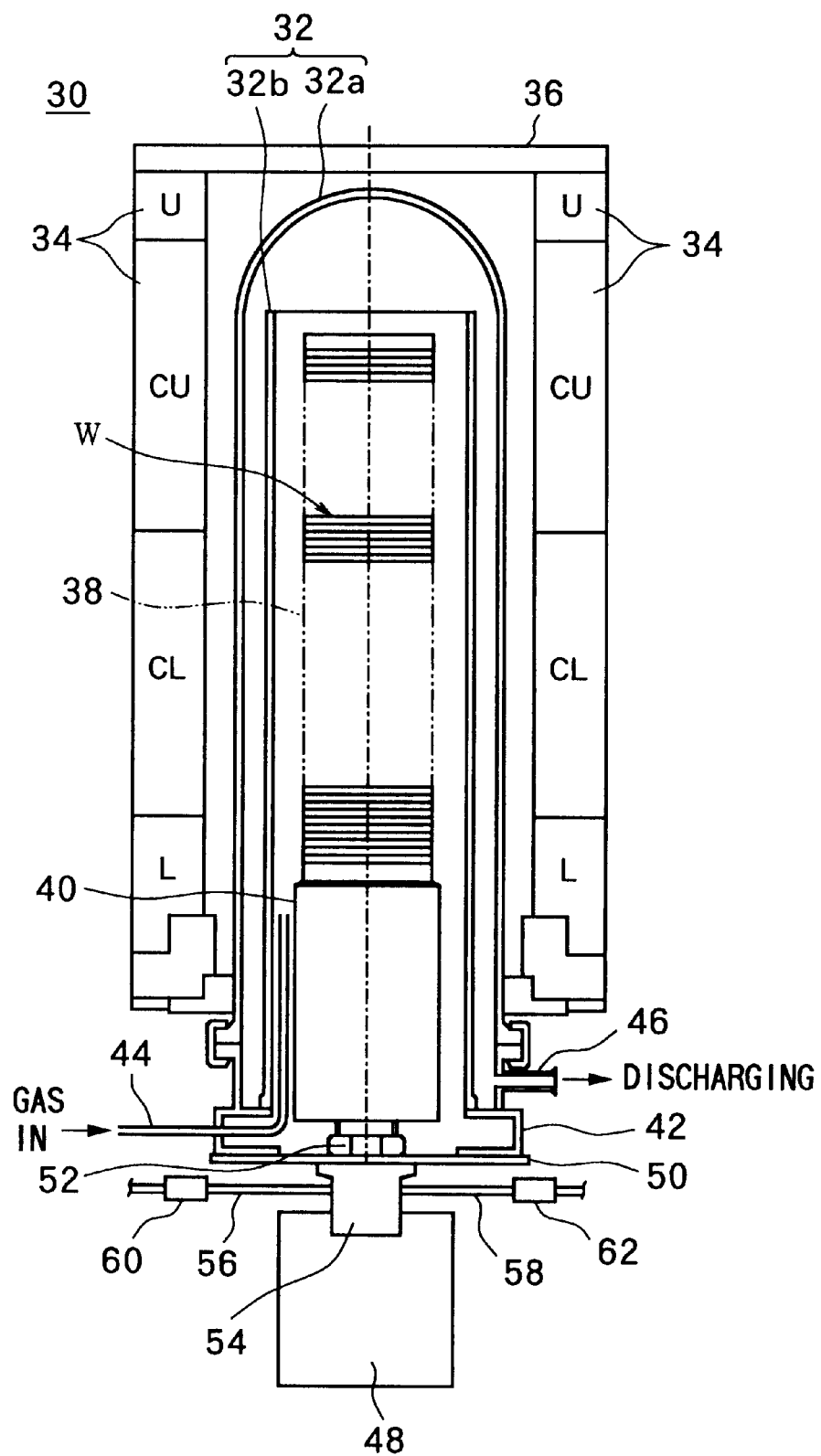
FIG. 2 is a view of the configuration of the core part of an upright oxidation-diffusion apparatus according to an embodiment of the present invention.

FIG. 1 is a view of the configuration of the core part of a CVD apparatus to which the present invention is applied. FIG. 2 is a view of the configuration of the core part of an upright oxidation-diffusion apparatus to which the present invention is applied.

The CVD apparatus 1 shown in FIG. 1 is a parallel plate type plasma CVD apparatus wherein two electrodes are provided inside a reaction chamber 2. The lower electrode 4 serving also as a susceptor has a built-in heater etc. and is cylindrically shaped. A wafer W is placed over the same. The upper electrode 6 is connected to a power supply unit 8 secured to the top of the reaction chamber. An inlet 10 and an outlet 12 of a process gas are formed at the lower part of the reaction chamber 2.

A predetermined process gas is introduced from the inlet 10 to the reaction chamber 2, and high frequency power is applied between the two electrodes 4 and 6 from a not illustrated high frequency power source to generate a plasma of a low pressure reactive gas between the electrodes and thereby deposit a thin film of silicon oxide, silicon nitride, etc. on the wafer.

In order to improve the uniformity of thin film formation, a rotation mechanism is provided to rotate the susceptor 4. That is, a hole 2a is formed in the bottom plate of the reaction chamber 2, a shaft (rotary shaft) 14 is provided for supporting the susceptor 4, and a rotary bearing unit 16 is attached outside of the reaction chamber 2 connected to the rotary shaft 14.

The rotary bearing unit 16 of the present example is a magnetic seal rotary bearing unit which secures the airtightness of the reaction chamber 2 by using the magnetic seal. The configuration of the inside of the magnetic seal rotary bearing unit 16 will be explained later.

In the present embodiment, a feed pipe 18 and an exhaust pipe 20 for the inert gas are connected to the magnetic seal rotary bearing unit 16. An introduction pressure control means for adjusting the introducing pressure of the barrier gas, for example, a mass flow controller 22, is provided in the feed pipe 18. An extraction pressure control means for adjusting an extracting pressure, for example, a flow control valve 24, is provided in the exhaust pipe 20.

A barrier gas comprised of an inert gas such as $N_2$, Ar, or He or an inert gas plus a slight amount of 100 ppm to 10% of dry $O_2$ is used controlled to a suitable flow rate within the range of 1 ml/min to 10 l/min. Also, the introduction and/or extraction pressure is controlled to a range of 0.1 Pa to 100 Pa so as not to influence the vacuum processing. The flow rate of the gas and the pressure are controlled by the mass flow controller 22 and the flow control valve 24.

The upright oxidation-diffusion apparatus 30 shown in FIG. 2 has a reaction tube 32 having a two-layer structure in consideration of the uniformity of the thin film to be formed and the impurity diffusion area. The reaction tube 32 is comprised of an outer tube 32a at the outside and an inner tube 32b at the inside.

At the outside of the reaction tube 32 is provided a heater 34 which can control the temperature divided into, for example, four levels as shown by "U", "CU", "CL", and "L" in the figure. The top of the heater 34 is covered by an insulating material 36.

Wafers W are set laterally at predetermined intervals in the perpendicular direction on a wafer holder 38 inside the inner tube 32b. A quartz cap 40 is provided at the lower portion of the inner tube 32b.

The reaction tube 32 itself is secured to a flange 42 made of stainless steel. A feed pipe 44 for process gas is inserted from one end of the flange 42 to inside the inner tube 32b. Also, an outlet 46 is provided at the other end of the flange 42.

To improve the uniformity of processing of the oxidation-diffusion apparatus 30, a rotation mechanism is provided for rotating the wafer holder 38. Specifically, in this example, an elevator 48 having a rotation mechanism is provided which moves the wafer holder 38 upward and downward along with the quartz cap 40. The reaction tube 32 has a bottom plate 50 having a hole formed at its center through which a rotary shaft 52 is passed for supporting the wafer holder 38 and the quartz cap 40. A rotary bearing unit 54 and the elevator 48 are provided beneath the bottom plate 50 connected to the rotary shaft 52. The elevator 48 has a stroke sufficient to shift all of the wafers W to the bottom outside of the reaction tube 32 and serves as a wafer transfer unit.

The rotary bearing unit 54 of the present example is a magnetic seal rotary bearing unit which secures air-tightness of the reaction tube 32 by using the magnetic seal. The configuration of the inside of the magnetic seal rotary bearing unit 54 will be explained below.

In the present embodiment, a feed pipe 56 and an exhaust pipe 58 are connected to the magnetic seal rotary bearing unit 54. An introduction pressure control means for adjusting the introducing pressure of the barrier gas, for example, a mass flow controller 60, is provided in the feed pipe 56. An extraction pressure control means for adjusting the extracting pressure, for example, a flow control valve 62, is provided in the exhaust pipe 58.

FIGS. 3 to 5 are schematic views of examples of the arrangement of the components in the above magnetic seal rotary bearing units 16 and 54.

As shown in FIGS. 3 to 5, a ball bearing means 70 for mechanically supporting the rotary shaft and a magnetic seal means 80 are arranged on the drive side (air side) of the rotary shafts 14 and 52 inside the magnetic seal rotary bearing unit. Also, a suction head 90 and a purge head 92 for discharging the barrier gas are provided on the vacuum processing chamber (reaction chamber 2 or reaction tube 32) side of the magnetic seal means 80. The ball bearing means 70 and the magnetic seal means 80 are arranged to surround the rotary shaft in the circumferential direction.

In Arrangement Example 1 shown in FIG. 3, at least one suction head 90 and purge head 92 are provided at the circumference of the rotary shaft. Preferably, more than one are provided at predetermined intervals.

The purge head 92 communicates with the feed pipes 18 or 56 in FIG. 1 or FIG. 2 and discharges a barrier gas, for example, an inert gas of $N_2$ or Ar, from the inlet 92a of the top of the purge head 92 to the open end side of the magnetic seal means 80.

The suction head 90 communicates with the exhaust pipe 20 or 58 in FIGS. 1 or 2. Barrier gas (and part of the process gas) is extracted from the outlet 90a of the top of the suction head 90 and exhausted to the outside.

Note that the purge head 92 is provided on the magnetic seal means 80 side and the suction head 90 is provided on the vacuum processing chamber side in the illustrated example, but it is also possible to arrange them in reverse with the purge head 92 provided on the vacuum processing chamber side and the suction head 90 on the magnetic seal means 80 side.

In Arrangement Example 2 shown in FIG. 4, a plurality of suction heads 90 and purge heads 92 are alternately arranged in the rotary shaft direction.

In Arrangement Example 3 shown in FIG. 5, the suction head 90 and the purge head 92 are arranged facing each other across the rotary shaft. By this, it is possible to make the barrier gas flow as an air curtain.

FIG. 6 is a sectional view of an example of the configuration of the magnetic seal rotary bearing unit in Arrangement Example 3, for example.

In the magnetic seal rotary bearing unit, the ball bearing means 70 and the magnetic seal means 80 are placed in the internal space inside a cylindrical-shaped unit housing 64 and a flange portion 66 provided on the end surface of the vacuum processing chamber side of the housing 64. The ball bearing means 70 rotatably supports a rotary shaft by rollers 70a provided therein. A cooling water path 64a is provided in the unit housing 64.

In the present example of the configuration, air paths 66b and 66c are formed in the flange 66 as the purge head 92 and the suction head 90 in FIG. 5.

The air path 66b is connected to the feed pipe 18 or 56 and the air path 66c is connected to the exhaust pipe 20 or 58.

The magnetic seal rotary bearing unit configured as above has the flange portion 66 air-tightly sealed on the outer surface side by an O-shaped ring 66a and is attached around the hole of the vacuum processing chamber.

Figure 7A:
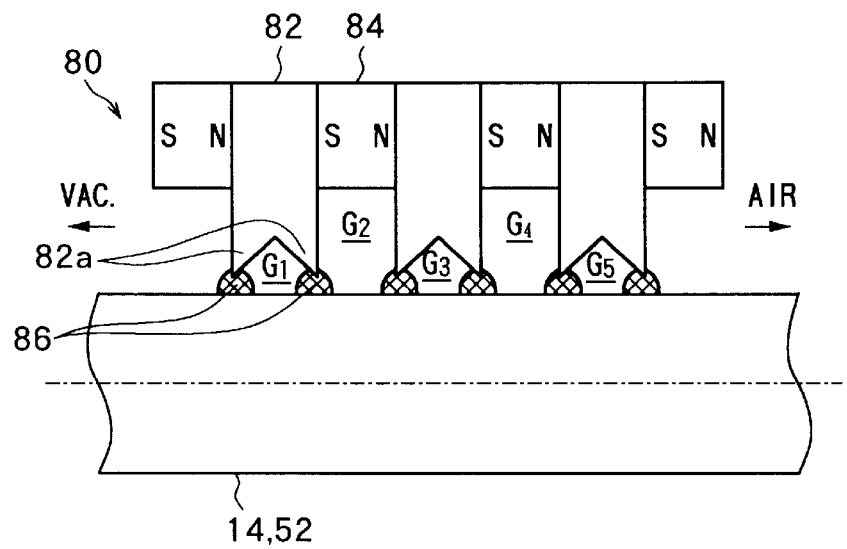
FIG. 7A is an enlarged view of the magnetic seal means.

FIG. 7A is an enlarged view of the magnetic seal means.

Figure 8A:
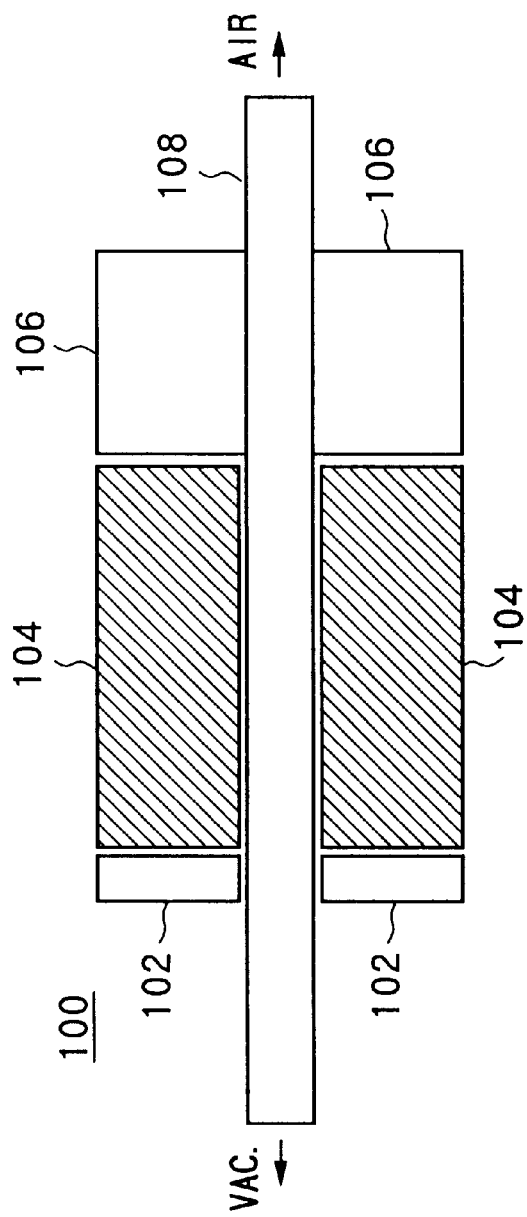
FIG. 8A is a view of the overall configuration of a magnetic seal rotary bearing unit of the related art.
Figure 8B:
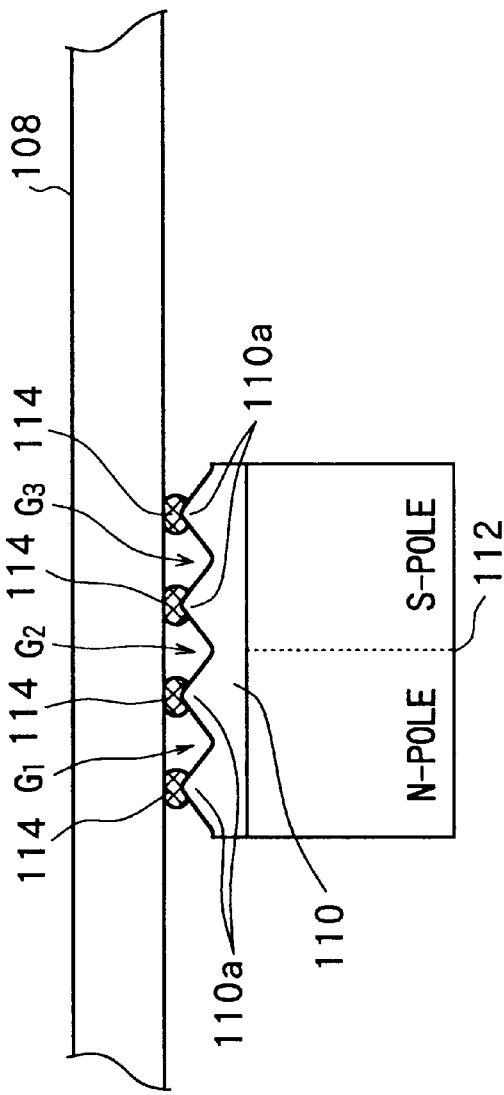
FIG. 8B is a view of the schematic structure of the magnetic seal means of a magnetic seal rotary bearing unit of the related art.
Figure 9:
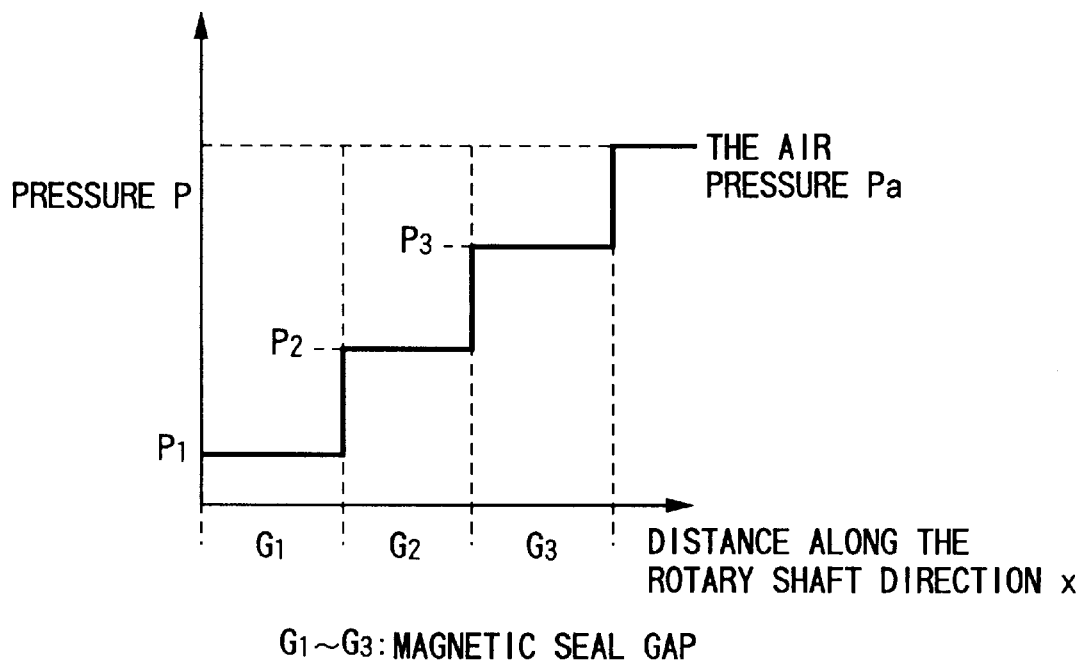
FIG. 9 is a view of the step-shaped changes of the inner pressure of the magnetic seal gap due to evacuation.

The magnetic seal means 80 comprises, as shown in FIG. 8B, pole pieces 82 and permanent magnets 84. The pole pieces 82 have ridges 82a and a plurality of magnetic seal gaps G1 to G5 formed therebetween. As the material for the pole pieces 82, stainless steel including a variety of metal elements such as Cr, Ni, Cu, Nb, Mo, Ti, Mn, and S is used.

The spaces between the ridges 82a of the pole pieces and the rotary shaft 14 or 52 are filled with magnetic fluid 86 comprised of a solvent made of vacuum oil in which are mixed iron oxide-based fine particles. As the solvent of the magnetic fluid 86, perfluoropolyether ($CF_3$—$(C_3F_5O)_x$—$(CF_2O)_y$—$CF_2$) or other complete fluorinated oil comprised of the three elements of carbon, fluorine, and oxygen is used. Also, as the iron oxide-based fine particles, for example, manganese zinc ferrite ($Mn.Zn.Fe_2O_3$) is used.

The magnetic fluid 86 has a high viscosity because it is oil-based and accumulates at the tips of the ridges 82a so as to fill the spaces between the rotating rotary shaft and the ridges 82a. Also, the magnetic fluid 86 is influenced by the magnetic field created by the permanent magnets 84 due to the intermixture of the magnetic material therein. As a result, the magnetic fluid 86 is prevented from concentrating at the high vacuum side due to evacuation.

Figure 7B:
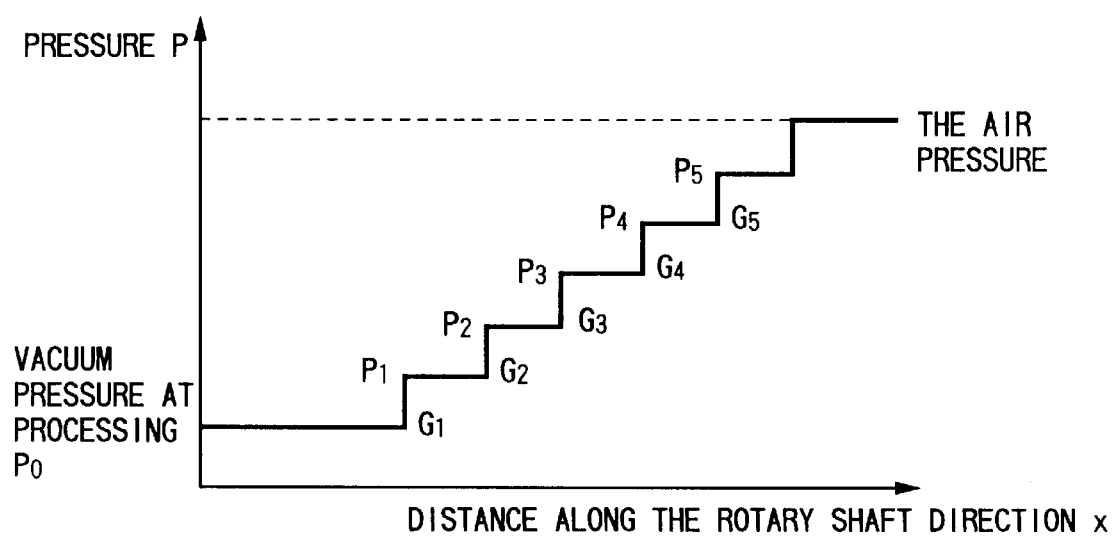
FIG. 7B is a view of the step-shaped changes in the inner pressure of the magnetic seal gap due to evacuation.

FIG. 7B shows the step-shaped changes of the inner pressure of the magnetic seal gaps due to evacuation. The abscissa of FIG. 7B indicates a distance x in the axial direction of the rotary shaft, and the ordinate indicates a pressure P.

As the evacuation proceeds, air bubbles start to move in the part of the magnetic fluid closest to the vacuum chamber due to the pressure difference between the two sides and an inner pressure P1 of the magnetic seal gap G1 gradually falls. When the inner pressure P1 of the magnetic seal gap G1 becomes lower to a certain degree, air bubbles start to move in the magnetic fluid of the part second closest to the vacuum processing chamber. Then, in the same way, air bubbles start to move in a chain reaction in other parts of the magnetic fluid. As a result, step-shaped differences are created in the inner pressures P1 to P5 of the magnetic seal gaps G1 to G5.

Finally, as shown in FIG. 7B, the inner pressure P1 of the magnetic seal gap G1 closest to the vacuum processing chamber becomes the lowest, the inner pressure P5 of the magnetic seal gap G5 closest to the drive side becomes a value closest to the air pressure Pa, and the inner pressures P2 to P4 of the magnetic seal gaps G2 to G4 become values changing in a step-shape.

In the magnetic seal means 80, by providing a large number of contact points with the magnetic fluid 86, the pressure difference at the two sides of the parts of the magnetic fluid 86 becomes smaller and breakage of the seal is prevented. In other words, in order not to break the seal of the parts of the magnetic fluid 86 even when exhausting quickly from the air pressure Pa, the volumes of the seal gaps G1 to G5 and the number of the contact points of the magnetic fluid 86 are determined in advance according to the maximum exhaust capability etc. of the usable exhaust pump. The structure of the magnetic seal means 80 of the present example corresponds to an exhaust apparatus (dry pump etc.) having an exhaust capability of a high vacuum of a vacuum degree of about $1 \times 10^{-5}$ to $1 \times 10^{-3}$ Pa from the atmosphere.

Note that in the above embodiments, the above introduction pressure control means (mass flow controllers 22 and 60) and/or the extraction pressure control means (flow control valves 24 and 62) may be controlled individually, however preferably control is performed linked with the vacuum degree of the vacuum processing chamber due to the above exhaust apparatus. This is for control so as not to allow the barrier gas to be discharged inside the vacuum processing chamber as much as possible within the range where the protective effect of the magnetic seal means 80 due to the discharge of the barrier gas can be obtained. Note that the barrier gas may be an inert gas plus a slight amount of $O_2$ of about 100 ppm (atmospheric concentration) to 10%. This is because the piping etc. is cleaned.

Each of the magnetic seal bearing units 16, 54 of the above embodiments has a ball bearing means 70 for mechanically supporting the rotary shaft. The air-tightness is maintained at a high level by the magnet seal means 80. Also, since particles from the ball bearing means 70 are blocked by the magnetic seal means 80 and not introduced into the vacuum processing chamber, a wafer is not contaminated by particles generated by contact of mechanical parts.

Also, for example, while introducing the process gas to the vacuum processing chamber or during the processing, the gas inside the vacuum processing chamber (process gas or reaction gas etc.) is blocked by the barrier gas discharged from the inlet 92a of the purge head and does not reach the magnetic seal means 80. Therefore, the stainless steel portion of the magnetic seal means 80 is not corroded.

Even if the magnetic seal means 80 is corroded and elements constituting the stainless steel and their oxides are produced from it, they are sublimed as low level oxides when a slight amount of $O_2$ is added. Then the sublimed oxides are immediately drawn from the gas outlet 90a of the suction head 90 and exhausted to the outside.

Furthermore, in the above embodiments, a mass flow controller 22 or 60 is provided as an introduction pressure control means of the inert gas and a flow control valve 24 or 62 is provided as an extraction pressure control means. Therefore, by adjusting an introducing pressure of the barrier gas from the gas inlet 92a and/or a suction pressure from the gas outlet 90a, almost all of the barrier gas can be discharged to the outside while maintaining the protective effect of the magnetic seal means 80 by the barrier gas. As a result, the contaminants are no longer carried by the barrier gas to inside the vacuum processing chamber. Even if contaminants are produced from the magnetic seal means 80, a wafer will not be contaminated by them.

Note that a variety of modifications can be made to the above embodiments.

For example, the mass flow controllers 22 and 60 and other introduction pressure control means and flow control valves 2 and 62 and other extraction pressure control means are both provided to facilitate the pressure control for exhausting almost all of the barrier gas to the outside while maintaining the protective effect of the magnetic seal means 80 by the barrier gas, however it is also possible to provide only one of them. Note that when the introducing pressure and the extracting pressure of the barrier gas are constant, the pressure may be controlled structurally by the design of the pipe diameter, the constricted structure of the gas inlet or outlet, etc.

Also, the permanent magnets 84 may be arranged for every other ridge 82a of the pole pieces or for every three ridges. Also, the shape of the gaps can be variously modified.

Furthermore, the configuration of the magnetic seal rotary bearing units 16 and 54 are not limited to the illustrated ones.

Further, the present invention may be applied to sputtering apparatuses, dry etching apparatuses, and other vacuum processing apparatuses.

Summarizing the advantageous effects of the invention, according to the vacuum processing apparatus and magnetic seal rotary bearing unit according to the present invention, it is possible to effectively prevent wafer contamination due to corrosion of the magnetic seal means and heavy metals and organic matter from the magnetic seal means. Further, contamination can be eliminated by a simple structure of just providing a gas inlet and gas outlet.

While the invention has been described with reference to specific embodiments chosen for purpose of illustration, it should be apparent that numerous modifications could be made thereto by those skilled in the art without departing from the basic concept and scope of the invention.

What is claimed is:

1. A vacuum processing apparatus comprising:
    a vacuum processing chamber;
    a rotated member rotated inside of the vacuum chamber;
    a rotary shaft penetrating one side of the vacuum chamber and rotating the rotated member;
    a magnetic seal means provided at the outside of the vacuum processing chamber through which the rotary shaft is penetrated and around the rotary shaft of the outside of the vacuum processing chamber, a cavity being defined between an inner wall of the magnetic seal means and the rotary shaft, said magnetic seal means maintaining the air-tightness in the vacuum processing chamber by using a magnetic fluid in the cavity;
    a gas inlet introducing a barrier gas to the cavity; and
    a gas outlet extracting a gas inside the cavity.

2. A vacuum processing apparatus according to claim 1, wherein said gas inlet and said gas outlet are arranged close to each other.

3. A vacuum processing apparatus according to claim 1, wherein a plurality of said gas inlets and said gas outlets are provided and the gas inlets and gas outlets are arranged alternately.

4. A vacuum processing apparatus according to claim 1, wherein said gas inlet and said gas outlet are arranged facing each other across said rotary shaft.

5. A vacuum processing apparatus according to claim 1, comprising at least one of a gas introduction pressure control means for controlling an introducing pressure of said barrier gas and a gas extraction pressure control means for controlling an extracting pressure of said gas outlet in a pipe communicating with said gas inlet or said gas outlet.

6. A vacuum processing apparatus according to claim 5, wherein said gas introduction pressure control means controls the flow rate of said barrier gas to 1 ml/min to 10 l/min.

7. A vacuum processing apparatus according to claim 5, wherein said gas introduction pressure control means and/or said extraction pressure control means controls the pressure in the cavity to 0.1 Pa to 100 Pa so as not to influence the vacuum processing.

8. A vacuum processing apparatus according to claim 1, further comprising:
    a housing secured air-tightly sealing the surroundings of a hole formed at one side of said vacuum processing chamber and
    a bearing means provided in the housing and rotatably supporting said rotary shaft passing through said hole and extending inside said vacuum processing chamber,
    said magnetic seal means being arranged between said hole and said bearing means.

9. A vacuum processing apparatus according to claim 8, wherein said gas inlet and said gas outlet are formed at said rotary shaft supporting housing.

10. A vacuum processing apparatus according to claim 1, wherein said barrier gas comprises an inert gas or an inert gas plus 100 ppm to 10% of oxygen.

11. A magnetic seal rotary bearing unit comprising:
    a unit housing which flange portion is fixed on outside surrounding of a hole formed at one side of a vacuum processing chamber and penetrated by a rotary shaft of a vacuum processing apparatus;
    a bearing means provided at the inside of said unit housing for rotatably supporting the rotary shaft;
    a magnetic seal means provided at the inside of said unit housing and arranged between the bearing means and the flange portion, a cavity being defined between an inner wall of the magnetic seal means and rotary shaft, said magnetic seal means maintaining the air-tightness in the vacuum processing chamber by using a magnetic fluid in the cavity;
    a gas inlet introducing a barrier gas to the cavity; and
    a gas outlet extracting a gas inside the cavity.

12. A magnetic seal rotary bearing unit according to claim 11, wherein said gas inlet and said gas outlet are arranged close to each other.

13. A magnetic seal rotary bearing unit according to claim 11, wherein a plurality of said gas inlets and said gas outlets are provided and the gas inlets and gas outlets are arranged alternately.

14. A magnetic seal rotary bearing unit according to claim 11, wherein said gas inlet and said gas outlet are arranged facing each other across said rotary shaft.

* * * * *